United States Patent [19]
Redfield

[11] 3,973,994
[45] Aug. 10, 1976

[54] SOLAR CELL WITH GROOVED SURFACE
[75] Inventor: David Redfield, Princeton, N.J.
[73] Assignee: RCA Corporation, New York, N.Y.
[22] Filed: Mar. 11, 1974
[21] Appl. No.: 450,000

[52] U.S. Cl. ............................................ 136/89
[51] Int. Cl.² ..................................... H01L 31/02
[58] Field of Search ................................. 136/89

[56]  References Cited
UNITED STATES PATENTS

| 2,320,185 | 5/1943 | Lamb | 136/89 |
| 2,884,508 | 4/1959 | Czipott et al. | 136/89 X |
| 2,915,578 | 12/1959 | Pensak | 136/89 |
| 3,104,188 | 9/1963 | Moncrieff-Yeates | 136/89 |
| 3,460,240 | 8/1969 | Tarneja et al. | 136/89 X |

FOREIGN PATENTS OR APPLICATIONS 1,028,417   5/1966   United Kingdom................. 136/89

OTHER PUBLICATIONS
Rahilly, "Hardened Solar Cells", in Conf. Record of the 7th Photovoltaic Conf., Pasadena, Calif., 19–21, Nov. 1968, pp. 82–84.

Primary Examiner—Allen B. Curtis
Attorney, Agent, or Firm—Glenn H. Bruestle; Daniel N. Calder; Donald S. Cohen

[57]  ABSTRACT

A thin layer of active semiconductor material is on the flat surface of a transparent substrate. The opposite surface of the substrate is grooved, and is coated with a layer of reflective material. Light that passes through the active semiconductor material and is incident on the reflective layer is reflected back to the active layer at such an angle as to cause the light to be totally internally reflected at the surface of the active layer. The angle at which the light is reflected back to the active layer is determined by the angle of the surface of the grooves.

9 Claims, 3 Drawing Figures

SOLAR CELL WITH GROOVED SURFACE

BACKGROUND OF THE INVENTION

The present invention relates to solar cells. More specifically, the present invention relates to solar cells with a very thin layer of active material on a surface of a transparent substrate whose opposite surface is grooved at a certain angle, and on which is a layer of reflective material.

In the past it was not the practice in making solar cells of materials like silicon to use thin layers of active material because it resulted in a severe loss in solar cell light absorption.

The loss of light absorption is due to the fact that for the active material, typically silicon, the longer the wavelength of the incident light, the weaker the active material's light absorption. If absorption is weak, the incident light will penetrate through the active material and not be absorbed. To assure absorption of that portion of the solar spectrum consisting of long wavelength radiation, a thick layer of active material was needed. Once the light has been absorbed in the active material, an electron-hole pair is generated. To assure that the lifetime of the generated minority carrier, be it a hole or an electron, was sufficient for the generation of current, the active material had to be of a high quality. In other words, the lifetime of the generated carrier is a dominant factor in determining the diffusion length of carriers generated in the active material. Diffusion length is the average distance a carrier can travel before it recombines. Since a thick layer of active material was required for absorption, a diffusion length at least as great as the active layer thickness was needed to assure current generation by the carriers formed deep in the active layer. Therefore, in the past, a solar cell consisted of a thick layer of highly pure active material.

If a thinner layer of active material could be used, a lower-cost solar cell would result for two reasons. First, a thin layer of active material would greatly reduce the required amount of active material, which is costly. Secondly, a thin layer of active material would require a proportionally shorter diffusion length for optically generated electrons and holes. The ability to use shorter diffusion lengths would allow the use of active material of lower quality, an additional cost saving. Therefore, a much desired need is a solar cell with a thin layer of moderate purity active material with little loss in solar light absorption.

SUMMARY OF THE INVENTION

A solar cell including a transparent substrate having a pair of opposed surfaces. An active layer of semiconductor material having a surface of incidence is on one surface of the substrate. Grooves are in the other surface of the substrate and a reflective layer is on the surface of the grooves.

DETAILED DESCRIPTION

Figure 1:
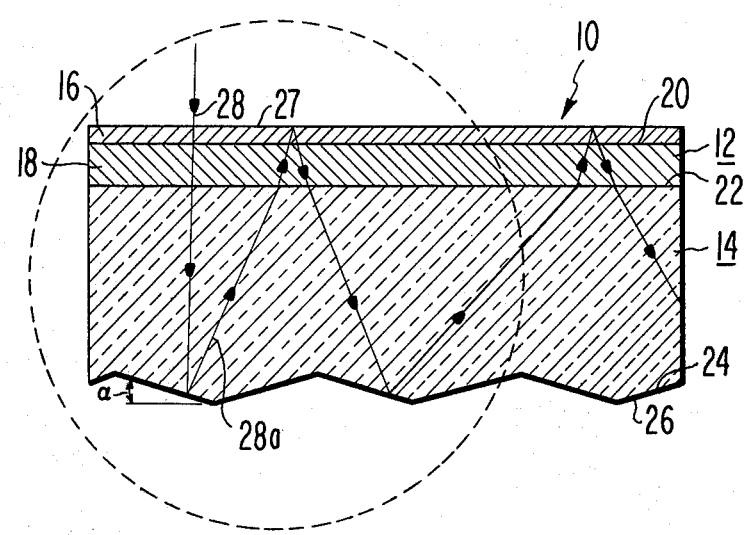
FIG. 1 is a cross-sectional view of a form of the low-cost solar cell of the present invention.

Referring to FIG. 1, a form of the low-cost solar cell is designated at 10. The solar cell 10 includes a thin layer of active material 12 on a substrate 14.

The active layer 12 is a semiconductor material, such as silicon, with a light incidence surface 27, an N-type region 16, a P-type region 18, and a P–N junction 20 therebetween. Region 16 can as well be of P-type and region 18 can be of N-type with no essential change in results.

The substrate 14 is of any material which is transparent to light. For example, the substrate 14 can be of sapphire, spinel, high temperature glass or quartz. If the substrate 14 is of sapphire of spinel, it has the advantage of permitting the epitaxial growth of the active layer 12 thereon.

Substrate 14 has two opposing surfaces, which are the flat surface 22 and the grooved surface 24. The active layer 12 is on the flat surface 22. The grooved surface 24 is in the form of a polished sawtooth pattern with the surface of each sawtooth at an angle $\alpha$. On the grooved surface 24 is a reflective layer 26. The reflective layer 26 is typically of a metallic material with good light reflection characteristics.

The solar light ray 28, falling on the active layer 12 at incident surface 27 optically generates electrons and holes in the active layer 12, at the points where the light ray 28 is absorbed. A characteristic of silicon, which is typically of what the active layer 12 comprises, is a weak absorption for low frequency radiation. The spectrum of solar light comprises colors of varying frequencies, many of which are of a sufficiently low frequency that their radiation will penetrate deeply into an active layer of such a solar cell before it will be absorbed. A thick active layer is needed to assure total absorption of solar light.

The typical solar cell has an active layer thickness on the order of 250 microns, but in the present invention the active layer 12 is 2.5 microns or less in thickness. The ability to use this reduction in active layer thickness is the result of the grooved surface 24 and reflective layer 26.

In the present invention, portions of the light ray 28 having low frequencies will tend to penetrate active layer 12 without being absorbed. However, they will not penetrate reflective layer 26 and are reflected back into the active layer 12 of the solar cell 10. By the proper choice of the angle $\alpha$, the reflected ray 28($a$) can be made to undergo total internal reflection upon reaching the incident surface 27. This retains the reflected ray 28($a$) within the solar cell 10, giving it multiple opportunities to be absorbed by the active layer 12.

According to Snell's Law, which is well known in the art, to achieve total internal reflection of the ray 28($a$), the ray 28($a$) must fall on incident surface 27 at an angle of incidence greater than the critical angle $\theta_c$. The critical angle is calculated by the following formula:

$$1. \sin \theta_c = n_0 / n_1$$

where $n_1$ is the absolute index of refraction for the first medium through which the light passes, and $n_o$ is the absolute index of refraction of the second medium to which the light, if totally internally reflected, will not pass. Therefore, if the active layer 12 comprises the material silicon, whose index of refraction $n_1$ is 3.5, and the second medium is air, whose index of refraction $n_0$ is 1, the critical angle is approximately 17°. Any reflected light ray emerging toward incident surface 27 at an angle greater than 17° will be totally internally reflected back into the solar cell 10.

Figure 2:
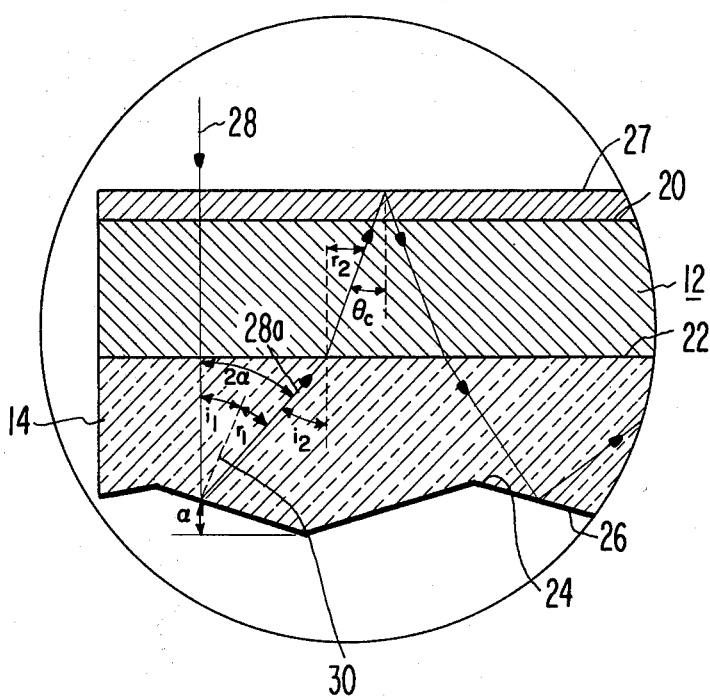
FIG. 2 is an enlarged view of the encircled portion of FIG. 1.

Referring to FIG. 2, achieving total internal reflection of the reflected light ray 28(a) is dependent, in the present invention, on the angle $\alpha$ of the reflective layer 26. The surface of the sawteeth forming the grooved surface 24 are at an angle $\alpha$ and, therefore, the reflective layer 26 on the grooved surface 24 will be at an angle $\alpha$ with respect to light ray 28. It is a principle of light reflection, well known in the art, that a ray of light reflected by a reflective surface will have an angle of incidence equal to the angle of reflection. When the light ray 28 reflects off the layer 26, its direction changes by an angle twice the value of angle $\alpha$. A perpendicular line 30 drawn to the reflective layer 26 illustrates that the light ray 28 falls on the reflective surface at an angle of incidence, $i_1$, equal to $\alpha$ and is reflected from the reflective layer 26 by an angle of reflection, $r_1$, also equal to $\alpha$, thus, the total angle at which the light ray 28 has been reflected is 2 $\alpha$.

According to the basic principles of geometry, the reflected light ray 28(a) will strike the flat surface 22 at an angle of incidence $i_2$ equal to 2 $\alpha$. By then utilizing Snell's Law the angle of refraction, designated $r_2$, as the reflected ray 28(a) passes from the substrate 14 to the active layer 12 can be calculated. The formula used to make this calculation is as follows:

$$\frac{\sin i_2}{\sin r_2} = \frac{n_{ACTIVE}}{n_{SUB}} \qquad (2)$$

wherein $i_2$ is the angle of incidence of the reflected ray 28(a) and is equal to 2 $\alpha$ in the present invention, $r_2$ is the angle of refraction of the reflected ray 28(a), $n_{ACTIVE}$ is the index of refraction of the active layer 12 and $n_{SUB}$ is the index of refraction of the substrate 14. Again, according to basic principles of geometry, the angle of refraction, $r_2$, is the angle at which the reflected light ray 28(a) will strike the incident surface 27, and if this angle is greater than the critical angle $\theta_c$, calculated by formula 1, total internal reflection will occur. Therefore, by properly selecting the angle $\alpha$ of the grooved surface 24 and reflecting layer 26, total internal reflection of light is possible.

After the reflected ray 28(a) has been reflected back from the incident surface 27, it will continue being reflected through the solar cell 10 for a finite number of times. Each time it is reflected off of the incident surface 27 it causes two more traversals of the active layer 12, thus increasing the opportunity for absorption. The finite number of passes which the light ray makes through the solar device simulates the absorption of a light ray travelling through a solar cell with a much thicker active layer.

Once the light has been absorbed in the active layer 12 a hole-electron pair is generated. The minority carriers optically generated in both the P-type region 18 and the N-type region 16 diffuse toward the P-N junction 20. Current is generated by the solar cell 10 only when the minority carriers, with sufficiently long lifetimes, diffuse to the junction 20. The lifetime of a minority carrier is the mean time it can travel in a majority region and remain a free charge. A long minority carrier lifetime requires the material composing the active layer to be very pure.

In the present invention the active layer 12 is very thin. This makes it possible for minority carriers with a short lifetime to diffuse to the junction 20. A lifetime as much as 1000 times lower than that of conventional solar cells can be tolerated in the present invention. Since a short minority carrier lifetime is tolerable, the active layer can be composed of a material of lower quality, possibly even polycrystalline silicon, instead of the higher quality single crystalline silicon. Therefore, the cost of the present invention is lower than the cost of conventional silicon solar cells, because only a thin active layer is needed, saving substantially on the quantity of the active layer, and because the active semiconductor material composing the active layer can be of a lower quality than is normally required.

An additional cost saving will result if the substrate is noncrystalline, such as a high-temperature glass or quartz. A glass or quartz substrate will tend to be less costly than a substrate of sapphire, although the active layer 12 can be epitaxially grown onto a sapphire substrate. An important advantage that results from the use of a very thin layer of active material in the present invention is that low cost substrate material, such as glass or quartz, can have a thin layer of active material of adequate quality deposited on it, but a thick layer of active material deposited on a low cost substrate will be of unacceptable quality.

In the first embodiment of the present invention shown in FIG. 1, a single crystalline active layer 12 can be deposited on the flat surface 22 of a sapphire or spinel substrate 14 by a variety of well known deposition means such as described in U.S. Pat. No. 3,658,586, issued Apr. 25, 1972 to C. C. Wang. A thin layer of polycrystalline silicon can be deposited on a low cost substrate material by a process such as described in the article, "Low Temperature Growth and Properties of Polycrystalline Silicon," by Y. S. Chiang, SEMICONDUCTOR SILICON 1973, edited by H. R. Huff and R. R. Burgess, Electrochemical Society (Princeton, N.J. 1973), pages 285–291. A P-N junction is formed in the active layer 12 by using any of a variety of junction-forming processes such as ion implantation for the introduction of doping impurities to form region 16. The forming of grooved surface 24 in the substrate 14 is accomplished by standard polishing techniques, if the substrate 14 is sapphire. If the substrate 14 is a high-temperature glass or quartz, the grooved surface 24 may be molded into the substrate 14. After the grooved surface 24 is formed, a metallic material is deposited on the grooved surface 24 to form the reflective layer 26.

Figure 3:
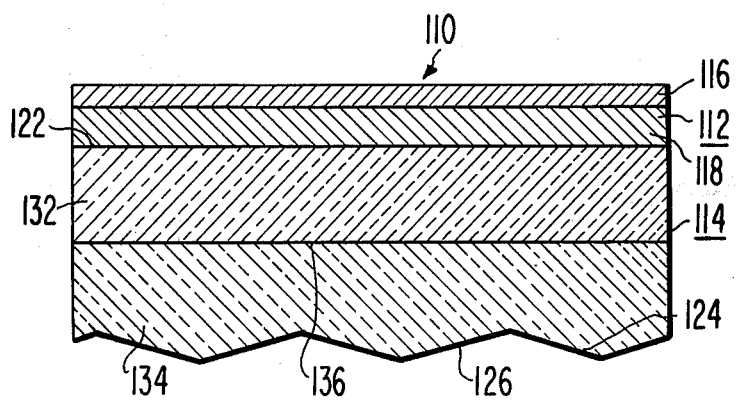
FIG. 3 is another form of the low-cost solar cell of the present invention.

Referring to FIG. 3, a second embodiment of the solar cell of the present invention shown therein is designated as 110. The solar cell 110 is similar in structure to the prior embodiment of the solar cell designated as 10 and shown in FIG. 1. The solar cell 110 includes a thin active layer 112 and a substrate 114. Active layer 112 is the same as active layer 12. Active layer 112 includes an N-type region 116 and a P-type region 118 which are the same as regions 16 and 18 respectively of solar cell 10.

In this embodiment the substrate 114 has two transparent regions. One region is a deposition region 132. The active layer 112 is on the deposition region 132 at a flat surface 122. The flat surface 122 is the same as flat surface 22. In contact with the deposition region 132 is the reflector region 134, forming a boundary 136 therebetween. Opposite boundary 136 is a grooved surface 124 upon which is the reflective layer 126. Grooved surface 124 and reflective layer 126 are the same as grooved surface 24 and reflective layer 26, respectively.

The deposition region 132 is of a transparent material, which is compatible with nucleation of the growth of the active layer 112 on the deposition region 132 at the flat surface 122. The deposition region 132 can be of high-temperature glass, quartz, sapphire or spinel. The reflector region 134 is of a glass or plastic material.

The deposition region 132 may be bonded to the reflector region 134, at the boundary 136, with a bonding material transparent to light.

In the prior embodiment of the present invention there was no suggestion that the substrate 14 could be a plastic. This was because most processes for depositing the active layer semiconductor material on the substrate require heat that would distort plastic. In the second embodiment of the solar cell 110, the reflector region 136 can be plastic since little or no heat is needed in the bonding process.

In the second embodiment of the present invention, the active layer 112 is deposited on the substrate 114, but a cost savings results from the use of a smaller amount of nucleating material which is generally more expensive than the materials comprising the reflector region 136. An additional cost savings results since grooves are easily molded into a glass or plastic reflector region 136. For other materials such as sapphire, grooves can only be formed in the material by a more expensive polishing process. As in the first embodiment of the solar cell, the second embodiment is lower in cost since only a small amount of low quality semiconductor material is needed for the active region 112.

Therefore, the present invention provides a lowcost solar cell because a lesser amount of the active layer material is needed, it can be of a lower quality, and the substrate is of a lesser amount of expensive nucleating material.

I claim:

1. A solar cell comprising a substrate transparent to solar light having a pair of opposed surfaces, an active layer of silicon semiconductor material on one surface of said substrate, said active layer having a surface of incidence, grooves in the other surface of said substrate, means for reflecting solar light at the surface of the grooves, said active layer being no greater than about 2.5 microns in thickness.

2. The solar cell in accordance with claim 1 in which said grooves are in the form of a sawtooth pattern.

3. The solar cell in accordance with claim 2 in which said surface of the grooves are at an angle such that light reflected from said reflective means will strike said incident surface at such an angle as to be totally internally reflected.

4. The solar cell in accordance with claim 1 in which said active layer has an N-type and a P-type conductivity region and a P-N junction therebetween.

5. The solar cell in accordance with claim 1 in which said substrate is of a transparent material selected from the group consisting of high-temperature glass, quartz, sapphire and spinel.

6. The solar cell in accordance with claim 1 in which said substrate has a deposition region contiguous to said active layer, which is of a material that will nucleate the growth of said active layer, and a reflector region in contact with said deposition region.

7. The solar cell in accordance with claim 6 in which said deposition region is of a transparent material selected from the group consisting of high-temperature glass, quartz, sapphire and spinel.

8. The solar cell in accordance with claim 6 in which said reflector region is of a transparent material selected from the group consisting of plastics and glass.

9. The solar cell in accordance with claim 3 in which said reflective means is a reflective layer on the surface of said grooves.

* * * * *